(12) United States Patent
Daix et al.

(10) Patent No.: US 9,275,892 B2
(45) Date of Patent: Mar. 1, 2016

(54) METHOD OF HIGH TEMPERATURE LAYER TRANSFER

(75) Inventors: Nicolas Daix, Grenoble (FR); Konstantin Bourdelle, Crolles (FR)

(73) Assignee: SOITEC, Bernin (FR)

( * ) Notice: Subject to any disclaimer, the term of this patent is extended or adjusted under 35 U.S.C. 154(b) by 10 days.

(21) Appl. No.: 13/990,539

(22) PCT Filed: Nov. 23, 2011

(86) PCT No.: PCT/EP2011/070756
§ 371 (c)(1),
(2), (4) Date: Jul. 22, 2013

(87) PCT Pub. No.: WO2012/072459
PCT Pub. Date: Jun. 7, 2012

(65) Prior Publication Data
US 2013/0302970 A1    Nov. 14, 2013

(30) Foreign Application Priority Data
Nov. 30, 2010 (FR) ..................................... 10 59903

(51) Int. Cl.
H01L 21/30 (2006.01)
H01L 21/46 (2006.01)
H01L 21/762 (2006.01)

(52) U.S. Cl.
CPC ................................ *H01L 21/76254* (2013.01)

(58) Field of Classification Search
CPC ................................................ H01L 21/76254
USPC ................................................. 438/455, 458
See application file for complete search history.

(56) References Cited

U.S. PATENT DOCUMENTS

| 5,374,564 A | 12/1994 | Bruel et al. |
| 6,756,286 B1 | 6/2004 | Moriceau et al. |
| 6,828,216 B2 | 12/2004 | Schwarzenbach et al. |

(Continued)

FOREIGN PATENT DOCUMENTS

JP    2005085964 A    3/2005

OTHER PUBLICATIONS

Gibbons, JF., "Ion Implantation in Semiconductors—Part I Range Distribution Theory and Experiments", Proc. of IEEE, vol. 56 No. 3, 1968, pp. 295-320.*

(Continued)

*Primary Examiner* — Mary Wilczewski
*Assistant Examiner* — Erik T Peterson
(74) *Attorney, Agent, or Firm* — TraskBritt

(57) ABSTRACT

A method of transferring a layer from a donor substrate onto a receiving substrate comprises ionic implantation of at least one species into the donor substrate and forming a layer of concentration of the species intended to form microcavities or platelets; bonding the donor substrate with the receiving substrate by wafer bonding; and splitting at high temperature to split the layer in contact with the receiving substrate by cleavage, at a predetermined cleavage temperature, at the layer of microcavities or platelets formed in the donor substrate. The method further comprises, after the first implantation step and before the splitting step, ionic implantation of silicon ions into the donor substrate to form a layer of concentration of silicon ions in the donor substrate, the layer of concentration of silicon ions at least partially overlapping the layer of concentration of the species intended to form microcavities or platelets.

20 Claims, 5 Drawing Sheets

(56) References Cited

U.S. PATENT DOCUMENTS

| | | | |
|---|---|---|---|
| 7,229,898 | B2 | 6/2007 | Bourdelle et al. |
| 7,387,947 | B2 | 6/2008 | Cayrefourcq et al. |
| 7,407,548 | B2 | 8/2008 | Bourdelle et al. |
| 7,449,394 | B2 | 11/2008 | Akatsu et al. |
| 7,485,551 | B2 | 2/2009 | Hebras |
| 7,572,331 | B2 | 8/2009 | Bourdelle et al. |
| 7,575,988 | B2 | 8/2009 | Bourdelle et al. |
| 7,645,486 | B2 | 1/2010 | Bourdelle et al. |
| 7,670,929 | B2 | 3/2010 | Bourdelle et al. |
| 7,767,545 | B2 | 8/2010 | Bourdelle et al. |
| 7,799,651 | B2 | 9/2010 | Mazure et al. |
| 7,833,877 | B2 | 11/2010 | Bourdelle et al. |
| 7,871,900 | B2 | 1/2011 | Bourdelle et al. |
| 8,058,158 | B2 | 11/2011 | Bourdelle et al. |
| 8,241,942 | B2 | 8/2012 | Bourdelle et al. |
| 8,263,475 | B2 | 9/2012 | Radu et al. |
| 8,309,426 | B2 | 11/2012 | Bourdelle et al. |
| 8,309,431 | B2 | 11/2012 | Nguyen et al. |
| 2005/0156246 | A1* | 7/2005 | Lochtefeld et al. ........... 257/347 |
| 2006/0014363 | A1 | 1/2006 | Daval et al. |
| 2006/0040470 | A1 | 2/2006 | Ben Mohamed et al. |
| 2007/0026650 | A1 | 2/2007 | Hebras |
| 2007/0281445 | A1 | 12/2007 | Nguyen et al. |
| 2008/0064182 | A1* | 3/2008 | Hebras ................. 438/455 |
| 2008/0303061 | A1 | 12/2008 | Bourdelle et al. |
| 2010/0178749 | A1* | 7/2010 | Faure et al. ................ 438/458 |
| 2010/0289113 | A1 | 11/2010 | Bourdelle et al. |
| 2011/0165758 | A1 | 7/2011 | Bourdelle et al. |
| 2011/0241157 | A1 | 10/2011 | Mazure et al. |
| 2011/0287571 | A1 | 11/2011 | Bourdelle et al. |
| 2011/0294277 | A1 | 12/2011 | Bourdelle et al. |
| 2012/0228672 | A1 | 9/2012 | Daval et al. |

OTHER PUBLICATIONS

Ashworth, et al. "Representation of ion implantation profiles by Pearson frequency distribution curves", J. Phys. D: Appl. Phys. 23, 1990, pp. 870-876.*

Lu et al. "Hydrogen induced silicon surface layer cleavage", Applied Physics Letters 71, 1997, pp. 1804-1806.*

Hurley et al. "Studies of co-implanted helium and hydrogen with an intermediate annealing step for thermal splitting of bonded silicon to oxide-coated wafers", Vacuum, vol. 76, 2004, pp. 291-297.*

Fink et al. "Hydrogen implantation and diffusion in silicon and silicon dioxide", Appl. Phys. A vol. 61, 1995, pp. 381-388.*

Ishitani et al. "Monte Carlo Simulations on Scattering of Bombarded Ions in Solids", Japanese Journal of Applied Physics, vol. 11, No. 2, 1972, pp. 125-133.*

Carter et al. "The Collection of Ions Implanted in Semiconductors II Range Distributions derived from collection and sputter-etch curves", Radiation Effects, vol. 16, 1972, pp. 107-114.*

Auberton-Hervé et al., Why Can Smart-Cut Change the Future of Microelectronics?, Int. Journal of High Speed Electronics and Systems, vol. 10, No. 1, 2000, pp. 131-146.

International Search Report for International Application No. PCT/EP2011/070756 dated Dec. 22, 2011, 3 pages.

Tong et al., Semiconductor Wafer Bonding: Science and Technology, The electrochemical Society, 1999, pp. 117-118.

Written Opinion of the International Search Authority for International Application No. PCT/EP2011/070756, dated Dec. 22, 2011, 4 pages.

International Preliminary Report on Patentability, for International Application No. PCT/EP2011/070756, dated Jun. 4, 2013, 5 pages.

* cited by examiner

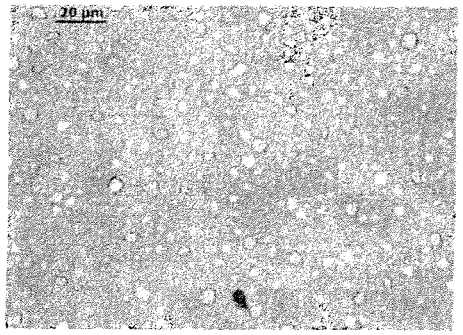
FIG.4
FIG.5
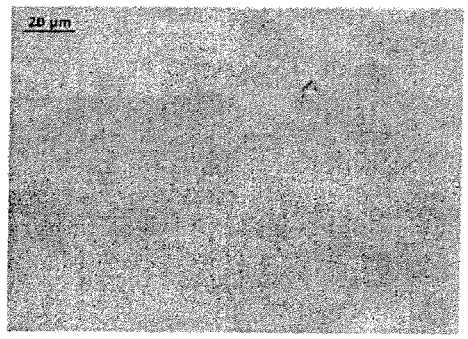
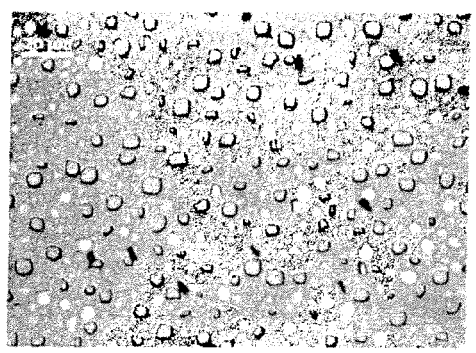
FIG.6
FIG.7
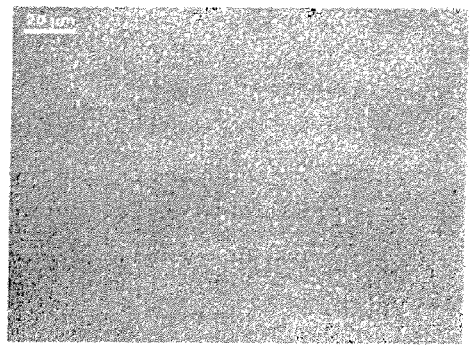

METHOD OF HIGH TEMPERATURE LAYER TRANSFER

CROSS-REFERENCE TO RELATED APPLICATIONS

This application is a national phase entry under 35 U.S.C. §371 of International Patent Application PCT/EP2011/070756, filed Nov. 23, 2011, designating the United States of America and published in English as International Patent Publication WO 2012/072459 A1 on Jun. 7, 2012, which claims the benefit under Article 8 of the Patent Cooperation Treaty and under 35 U.S.C. §119(e) to French Patent Application Serial No. 1059903, filed Nov. 30, 2010, the disclosure of each of which is hereby incorporated herein by this reference in its entirety.

TECHNICAL FIELD

The present invention relates to a method of transferring a layer from a donor substrate onto a receiving substrate used during the fabrication of heterostructures such as structures of the SeOI (semiconductor-on-insulator) type for electronics, microelectronics and optoelectronics applications.

BACKGROUND

A well-known technique for producing heterostructures by layer transfer is the SMART CUT® technique. A particular example of implementing the SMART CUT® technique is described in U.S. Pat. No. 5,374,564 or in the article by A. J. Auberton-Hervé et al. entitled "Why can Smart-Cut change the future of microelectronics?," *Int. Journal of High Speed Electronics and Systems*, vol. 10, No. 1, 2000, pp. 131-146. That technique employs the following steps:
  a) bombarding one face of a donor substrate (for example, formed from silicon) with light ions of the hydrogen or rare gas type (for example, hydrogen and/or helium) to implant those ions in sufficient concentration into the substrate; the implanted zone creates a layer of weakness by forming microcavities or platelets during splitting annealing;
  b) bringing that face of the donor substrate into intimate contact (bonding) with a receiving substrate; and
  c) splitting annealing, whereby the effect of a crystalline rearrangement and pressure in the microcavities or platelets formed from the implanted species causes fracture or cleavage at the implanted layer in order to obtain a heterostructure resulting from transfer of the layer of donor substrate onto the receiving substrate.

However, the heterostuctures obtained thereby exhibit defects, not only at the surface of the transferred layer but also at the interfaces of the layers constituting the heterostructure.

Various types of surface defects may appear after transferring a layer onto a receiving substrate. Such defects include: surface roughness, non-transferred zones (NTZ), blisters, voids, or voids of the COV (crystal-orientated void) type, etc.

Such defects have diverse origins, such as poor transfer, the presence of subjacent defects in the various layers of the structure, the quality of bonding at the interfaces or simply the various steps that have to be carried out in order to fabricate such structures (implantation of species, heat treatment, etc.).

In order to overcome those problems, various techniques have been developed such as, for example, low temperature annealing (in particular, as described in U.S. Patent Application No. 2006/0040470), plasma treatments that can increase bonding energies at the interfaces and result in splitting of the layer to be transferred with few defects. It is known that during a transfer, the higher the bonding energy between the donor substrate and the receiving substrate, the fewer will be the defects in the resulting heterostructure. The solutions developed, such as plasma treatment of the surface or surfaces to be bonded, are used to reinforce the bonding energy while limiting the temperature of the heat treatment applied for splitting, in order to limit the diffusion of contaminants.

Similarly, JP 2005/085964 proposes reinforcing the bonding energy before splitting the layer to be transferred by using a helium implantation step and then applying a splitting anneal at high temperature in ranges from 800° C. to 1100° C.

Another method, presented in U.S. Pat. No. 6,756,286, is intended to improve the surface quality of the transferred layer after splitting it. That method comprises forming a zone of inclusions to confine the gaseous species derived from implantation in order to reduce the surface roughness of the split layer by reducing the implantation doses and the thermal budget.

Finally, U.S. Pat. No. 6,828,216 proposes applying splitting annealing in two phases, the first phase being used to accomplish the start of unbonding of the layer to be transferred in a standard range of 400° C. to 500° C., and the second phase being used to finish unbonding with a view to obtaining a good quality surface with temperatures at the end of the anneal of approximately 600° C. to 800° C.

However, those current techniques are not suitable for all SeOI (semiconductor-on-insulator) type heterostructures, in particular, those comprising a thin buried oxide layer (UT-BOX, "Ultra Thin Buried OXide layer") or even containing no oxide layer, such as heterostructures of the DSB (direct silicon bonding) type.

In fact, with this type of heterostructure, since the oxide layer is thin or non-existent, the diffusing species (for example, gases) are not trapped in the thickness of the oxide layer and may be the source of many defects within the heterostructure.

DISCLOSURE

In order to overcome the above-mentioned disadvantages, the present invention proposes a solution that, during transfer of a layer between a donor substrate and a receiving substrate, can be used to reinforce the bonding energy between the layer to be transferred and the receiving substrate and, as a consequence, can limit defects in the resulting heterostructure.

To this end, the invention provides a method of transferring a layer from a donor substrate onto a receiving substrate, comprising:
  a) a first step of ionic implantation of at least one species into the donor substrate forming, at a predetermined first depth in the donor substrate, a layer of concentration of the species intended to form microcavities or platelets;
  b) a step of bonding the face of the donor substrate with a face of the receiving substrate by wafer bonding; and
  c) a step of splitting at high temperature to split the layer in contact with the receiving substrate by cleavage, at a predetermined cleavage temperature, at the layer of microcavities or platelets formed in the donor substrate;
  the method being characterized in that it further comprises, after implantation step a) and before splitting step c), a second step of ionic implantation of silicon ions into the donor substrate to form a layer of concentration of silicon ions at a second predetermined depth in the donor substrate, the layer of concentration of silicon ions at least partially overlapping the layer of concentration of at least one species intended to form microcavities or platelets.

Thus, by implanting the donor substrate with silicon ions in addition to the species intended to form a layer of platelets or microcavities for the purpose of splitting, the precursors of the platelets or microcavities, as well as the mono-lacunary complexes initially present in the substrates, are neutralized or "destroyed." As is explained below, this, therefore, reduces the quantity of voids normally present at the implanted zone intended to form a plane of weakness that allows cleavage/fracture of the substrate at this region, which means that a higher temperature is required during splitting annealing in order to cause cleavage/fracture of the thus implanted substrate.

As is explained below, it has been shown that the higher the temperature, the greater the reinforcement of the bonding energy. This reinforcement is even greater for temperatures that are higher than the temperatures normally used in splitting annealing.

For a silicon substrate implanted with hydrogen ions or co-implanted with helium/hydrogen ions, a temperature of at least 575° C. is necessary to allow the microcavities/platelets responsible for splitting to form and develop, at which temperature the bonding energy is higher, meaning that a heterostructure with fewer defects can be obtained.

In accordance with one aspect of the invention, the silicon ion implantation energy used during the second implantation step is higher than the implantation energy used during the first implantation step. The silicon ion implantation energy is adjusted as a function of the implantation energy used during the first implantation step. Thus, all or a portion of the layer of concentration of the species intended to form the platelets or microcavities can be overlapped.

In accordance with another aspect of the invention, the silicon ion implantation dose used during the second implantation step is adjusted as a function of the cleavage temperature desired during splitting step c). In fact, the greater the implanted dose of silicon ions, the more precursors of platelets/microcavities and mono-lacunary complexes are neutralized and the greater the temperature must be for splitting of the substrate.

The silicon ion implantation dose used during the second implantation step is preferably lower than the implantation dose of at least one species intended to form microcavities or platelets implanted during the first implantation step.

In accordance with one aspect of the invention, the donor substrate is formed from a semiconductor material. In particular, it may be a substrate of silicon, or germanium, or silicon-germanium, or gallium nitride or gallium arsenide or silicon carbide.

Optionally, the bonding surfaces of the donor substrate and the receiving substrate have preferably already been treated in order to render them hydrophobic, since bonding energy reinforcement is higher still with hydrophobic bonding.

BRIEF DESCRIPTION OF THE DRAWINGS

The characteristics and advantages of the present invention become apparent from the following description made by way of non-limiting indication with reference to the accompanying drawings in which:

FIGS. 4 and 6 show the result of the formation of platelets/microcavities in silicon substrates co-implanted with $H^+$ and $He^+$ ions after a heat treatment carried out at various temperatures; and FIGS. 5 and 7 show the result of the formation of platelets/microcavities in silicon substrates respectively implanted and heat treated in the same manner as with the substrates of FIGS. 4 and 6, the substrates of FIGS. 5 and 7 also having been implanted with silicon ions in accordance with the invention.

DETAILED DESCRIPTION

The present invention is applicable to any layer transfer method employing at least one step of ionic implantation of a donor substrate to define a layer to be transferred by means of a plane of weakness, bonding the implanted donor substrate onto a receiving substrate and applying a heat treatment, termed "splitting annealing," at a high temperature in order to split the layer to be transferred from the donor substrate, as in the SMART CUT® technique.

The principle of the invention comprises increasing the temperature from which, during splitting annealing, sufficient microcavities or platelets are formed or developed in the implanted zone to cause cleavage or fracture in the donor substrate so as to increase the bonding energy at the interface between the donor substrate and the receiving substrate. This temperature is termed the "cleavage temperature" in the present disclosure.

Typically, splitting annealing in the SMART CUT® technique for silicon type substrates is carried out in a temperature in the range of 400° C. to 500° C. for a predetermined period (the temperature/duration pairing corresponds to the thermal budget for splitting annealing).

In the work entitled "Semiconductor wafer bonding: Science and technology" by Q. Y. Tong and U. Gösele, The Electrochemical Society, Pennington, N.J., 1999, pages 117 and 118, variations in the bonding energy were measured as a function of temperature. The results obtained by the authors of that work are presented in FIG. 1, which shows the variations in bonding energy between two silicon substrates as a function of temperature, for silicon substrates assembled either by hydrophobic bonding (curve A), or by hydrophilic bonding (curve B).

Figure 1:
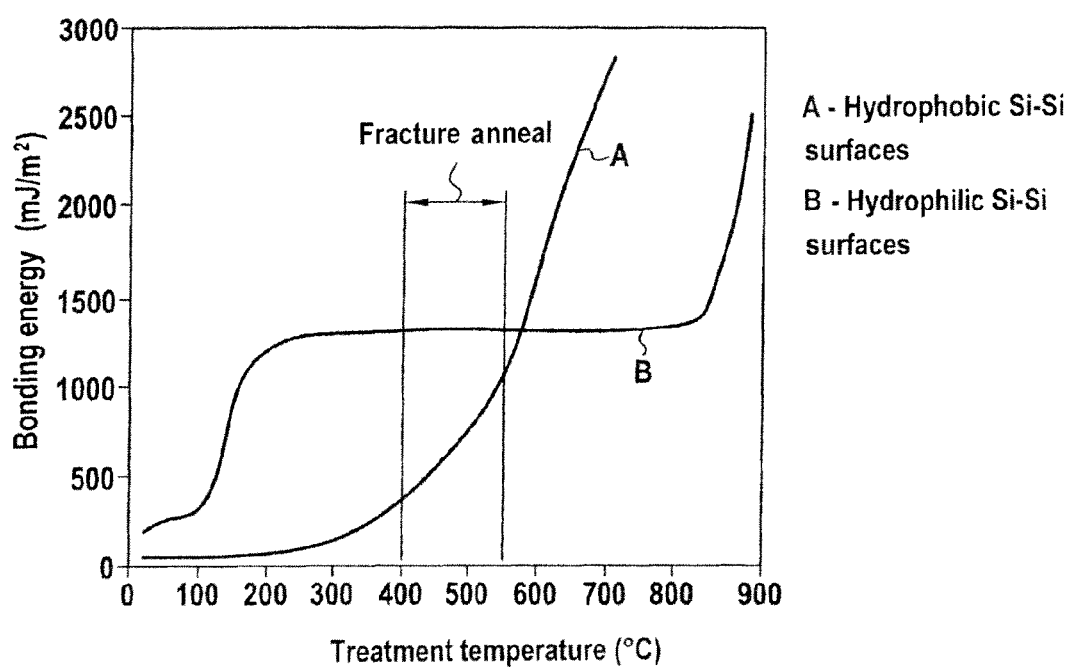
FIG. 1 shows the variations in bonding energy as a function of temperature.

Looking at FIG. 1, it can be seen that:

for hydrophilic bonding, the bonding interface energy is stable at about 1250 mJ/m² (millijoule per square meter) from 200° C., and then increases rapidly beyond 800° C.; while for hydrophobic bonding, the bonding energy increases exponentially with temperature.

As a consequence, by increasing the temperature of the heat treatment during splitting, the bonding energy is reinforced at the moment of layer transfer, which means that splitting of a layer can be accomplished with low defectivity.

A method of transfer of a layer in accordance with an implementation of the invention is described below with reference to FIGS. 2A to 2E and 3.

In this implementation, the starting substrate or donor substrate 1 is comprised of a wafer of mono-crystalline silicon covered with an insulating layer of silicon oxide ($SiO_2$), 2, obtained by thermal oxidation and having a thickness of approximately 300 Å (Angstroms). The donor substrate 1 may also be formed from other semiconductor materials, in particular, from germanium (Ge) or silicon-germanium (SiGe), for example.

Figure 2A:
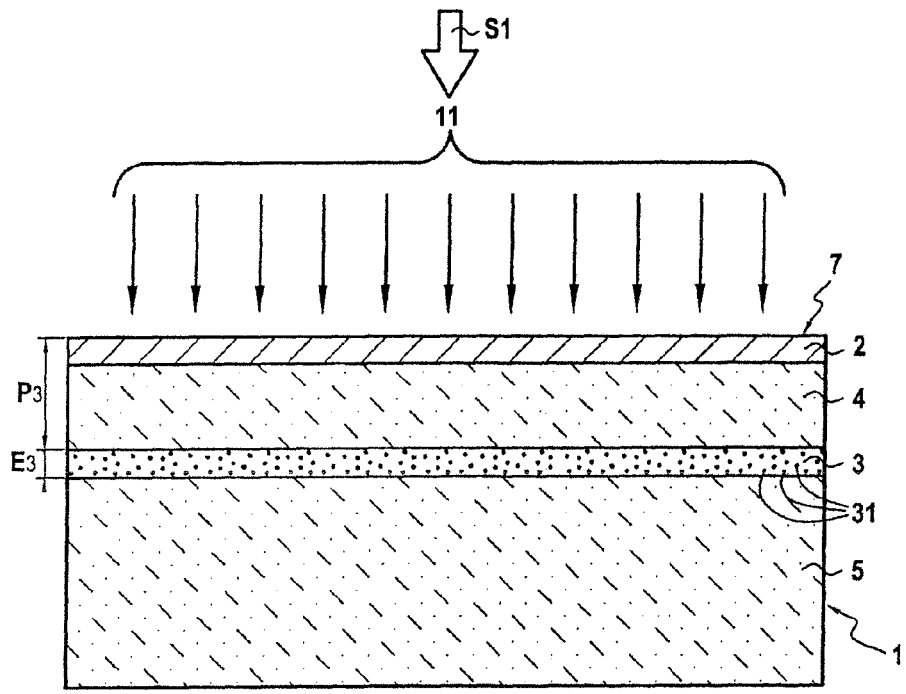
FIGS. 2A to 2E are diagrammatic cross-sectional views showing the transfer of a layer of silicon in accordance with one implementation of the invention.

The first step comprises carrying out ionic implantation, normally carried out with a view to splitting of the donor substrate layer, namely, by implanting one or more species (co-implantation) that are capable of forming microcavities or platelets at high temperature, the first implantation forming a layer of concentration of this or these species at a predetermined depth in the donor substrate (step S1, FIG. 2A).

In this splitting implantation step, the substrate 1 undergoes ionic bombardment 11 of $H^+$ ions through the planar face 7 of the substrate 1 comprising the ($SiO_2$) layer 2. The $H^+$ ions are implanted, for example, with an implantation energy that may be in the range from 20 keV (kiloelectron volt) to 150 keV and with an implantation dose in the range from approximately $3 \times 10^{16}$ to $6 \times 10^{16}$ atoms/$cm^2$ (atoms per square centimeter), preferably $5.5 \times 10^{16}$ atoms/$cm^2$. The implantation dose is selected such that the concentration of $H^+$ ions is sufficient to form and develop a layer of microcavities or platelets during a subsequent heat treatment step defining both a layer or thin film 4 in the upper region of the substrate 1 and also a portion 5 in the lower region of the substrate 1 corresponding to the remainder of the substrate 1.

The thus-implanted $H^+$ ions form a layer of concentration 3 of $H^+$ ions 31 that extends in the substrate 1 from a depth $P_3$ and over a thickness $E_3$.

The first implantation may also be carried out with hydrogen ions and helium ions (He/H co-implantation).

Figure 2B:
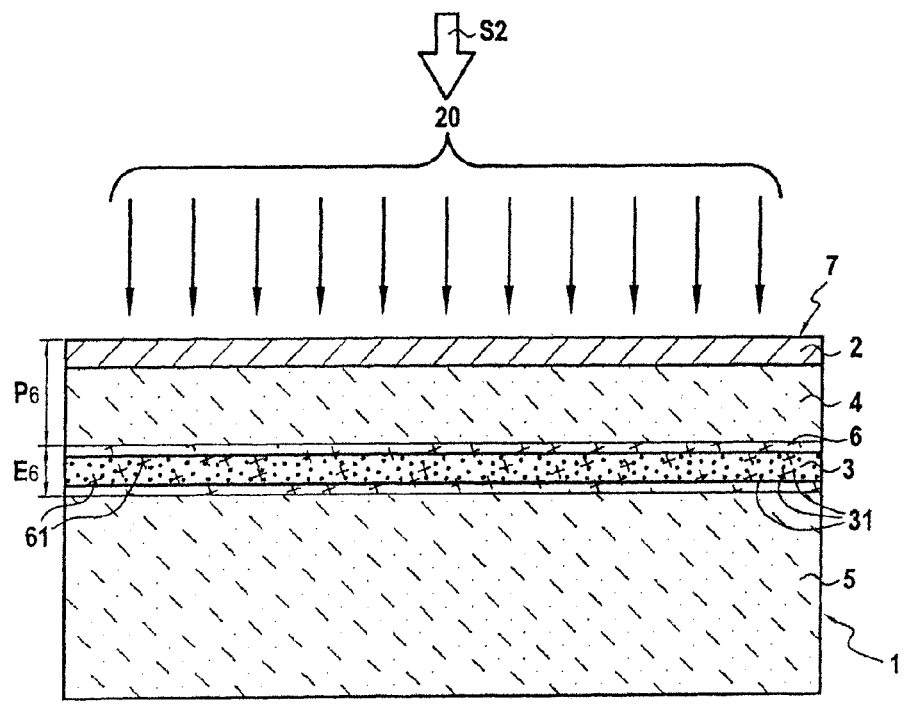

In accordance with the present invention, this first implantation step is followed by a second step of implanting silicon ions ($Si^+$) 20 into the donor substrate 1 (step S2, FIG. 2B). This thereby forms a layer of concentration 6 of $Si^+$ ions 61 that extends in the substrate 1 from a depth $P_6$ and over a thickness $E_6$.

The implantation energy of the $Si^+$ ions is selected as a function of the depth $P_3$ from which the layer of concentration 3 formed by $H^+$ ions 31 extends such that the layer of concentration 6 of $Si^+$ ions 61 at least partially overlaps the layer of concentration 3. For the same implantation energy, $Si^+$ ions penetrate less deeply into the substrate than $H^+$ ions. As a result, the implantation energy for $Si^+$ ions is higher than the implantation energy for $H^+$ ions. The implantation energy for the $Si^+$ ions is adjusted as a function of the implantation energy for the $H^+$ ions so as to implant the $Si^+$ ions at a depth equivalent to that of the $H^+$ ions.

By way of example, when the $H^+$ ions are implanted with an implantation energy that may be in the range from 20 keV to 150 keV, for example, the $Si^+$ ions are then implanted with an implantation energy in the range from 160 keV to 1.2 MeV (mega electron volt), knowing that the value for the implantation energy of $Si^+$ ions is selected as a function of that of the implantation energy of $H^+$ ions.

In the example described here, the layer of concentration 6 of $Si^+$ ions 61 completely overlaps the layer of concentration 3 of $H^+$ ions, but the concentration of $Si^+$ ions in the layer 3 is much lower than that for the $H^+$ ions.

However, the layer of concentration 6 may also extend in the substrate 1 from a depth that is shallower than or identical to that of the layer of concentration 3 and extend over a thickness such that it only partially overlaps the layer of concentration 3.

Further, the implantation dose used during implantation of the $Si^+$ ions is selected as a function of the envisaged cleavage temperature. In fact, as is explained below, the $Si^+$ ions neutralize or destroy the precursors of the platelets or microcavities that can accomplish cleavage of the substrate during splitting annealing. As a consequence, the greater the $Si^+$ ion implantation dose, the greater the number of platelet or microcavity precursors that are neutralized or destroyed and the higher the temperature must be to cause cleavage at the layer of concentration 3.

The $Si^+$ ion implantation dose is, however, preferably selected so as to be much lower than the $H^+$ ion implantation dose, so that cleavage of the substrate is not impeded.

Figure 2C:
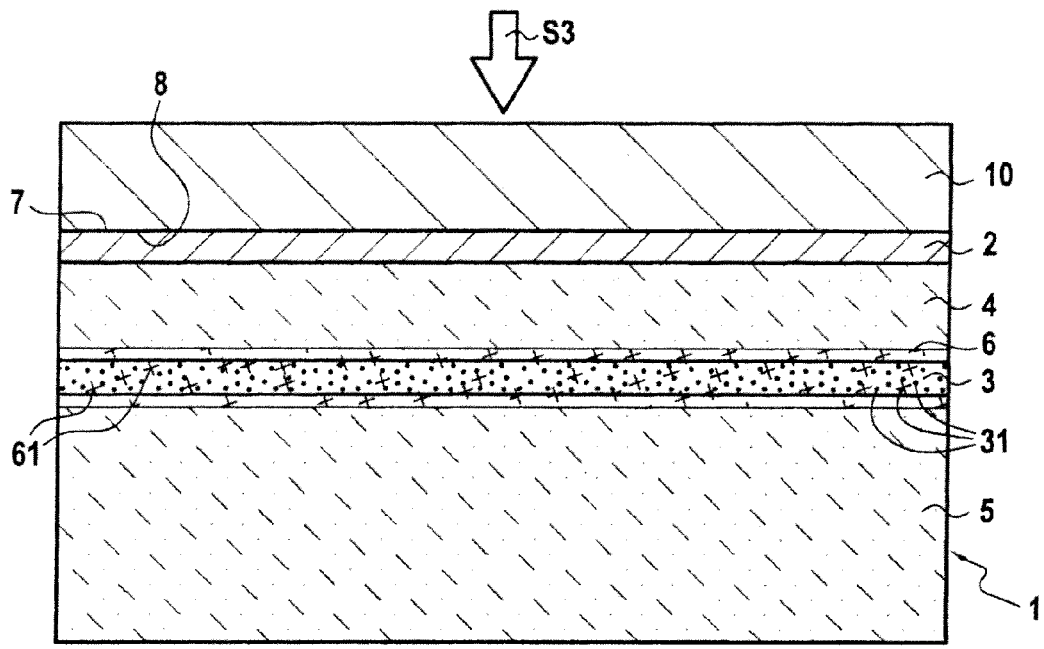

The donor substrate 1 is then bonded by wafer bonding onto a receiving substrate 10, for example, a silicon wafer (step S3, FIG. 2C). The principle of bonding by wafer bonding is well known per se and is not described in detail. In brief, bonding by wafer bonding is based on bringing two surfaces into direct contact, i.e., without using a specific material (adhesive, wax, low-melting-point metal, etc.), the attractive forces between the two surfaces being fairly high in order to cause wafer bonding (bonding induced by the resultant of the attractive forces (Van der Waals forces) of electronic interaction between atoms or molecules of the two surfaces to be bonded).

As indicated above with regard to FIG. 1, the bonding energy increases with temperature, in particular, because above a certain temperature, the majority of the bonds between the two surfaces in contact correspond to covalent bonds. Further, as indicated in FIG. 1, the bonding energy increases more steeply with temperature, in particular, beyond 550° C., when bonding is by hydrophobic bonding, i.e., when the surfaces of the substrates to be bonded have been rendered hydrophobic. The surfaces of the two substrates, for example, silicon, may be rendered hydrophobic by immersing the two substrates in a chemical cleaning bath of HF (hydrofluoric acid). The bonding surfaces 7 and 8 of the donor substrate 1 and the receiving substrate 10, respectively, are thus preferably pre-treated before bonding so as to render them hydrophobic.

Figure 2D:
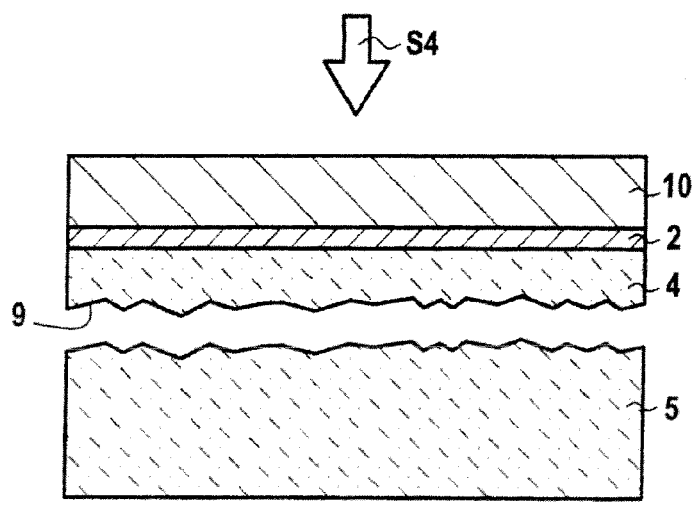

After the bonding step, splitting of the layer 4 from the substrate 1 is carried out by applying a heat treatment or splitting annealing resulting in cleavage of the substrate at the layer of concentration 3 of $H^+$ ions 31 (step S4, FIG. 2D).

However, in contrast to the temperatures normally encountered in the thermal budgets for splitting annealing in silicon substrates (temperatures typically in the range of 400° C. to 500° C.), here, the temperature of the thermal budget during splitting must be higher because of the implanted $Si^+$ ions. In fact, applying a high thermal budget, i.e., with temperatures of more than 500° C., in particular, in the range from 575° C. to 650° C., is necessary in order to allow the formation and development of the microcavities/platelets responsible for splitting.

More precisely, the implantation of $Si^+$ ions, in addition to implantation of one or more ionic species that may provoke cleavage of the implanted substrate, such as the implantation of $H^+$ ions or He/H co-implantation, will produce at least two effects on the phenomenon that normally occurs during splitting annealing. First, the implanted $Si^+$ ions will rupture some of the hydrogenated mono-lacunary complexes initially present in the substrate. In contrast, these ions will reduce the quantity of voids available in the crystalline network of the substrate implanted, for example, with $H^+$ ions, or co-implanted with He/H. Studies have shown that voids in a silicon substrate, e.g., corresponding to the absence of silicon atoms on a site that is normally occupied in the crystalline network of the silicon, play an important role in the formation of platelets/microcavities, and the cracks that lead to cleavage or fracture of the substrate are the result of platelets convalescing.

As a result, by reducing the quantity of voids in the crystalline framework at the implanted zone intended to form a cleavage/fracture plane, the appearance of microcracks is delayed since the population of the platelets/microcavities is reduced by implanting $Si^+$ ions. Thus, it is necessary to increase the splitting anneal temperature in order to obtain the formation of microcracks and cause cleavage in the substrate at the zone implanted with one or more ionic species that are capable of causing cleavage therein. The delay in the appearance of the microcracks and as a result the cleavage temperature, may be modulated as a function of the quantity of $Si^+$ ions that is implanted.

With a silicon substrate that has been implanted with $H^+$ ions or co-implanted with He/H, the implantation of $Si^+$ ions means that a cleavage temperature in the range of 575° C. to 650° C. can be obtained, while this cleavage temperature normally does not exceed 500° C. without the additional implantation of $Si^+$ ions.

FIGS. 4 and 6 show, in an implanted zone in silicon substrates obtained by co-implanting $H^+$ and He ions with an implantation energy in the range of 20 keV to 100 keV and with a total implantation dose (H+He) in the range of $1.2\times10^{16}$ atoms/cm$^2$ to $5\times10^{16}$ atoms/cm$^2$, the result of the formation of platelets/microcavities after a heat treatment (anneal) carried out at 392° C. for 136 minutes (FIG. 4) and at 460° C. for 60 minutes (FIG. 6), respectively.

FIGS. 5 and 7 show the result of the formation of platelets/microcavities in silicon substrates initially implanted under the same conditions as in FIGS. 4 and 6 but which, in accordance with the invention, has undergone additional implantation of $Si^+$ ions as described above. In the examples of FIGS. 5 and 7, the implantation of $Si^+$ ions was carried out with an implantation dose of $1\times10^{14}$ atoms/cm$^2$ and with an implantation energy of 360 keV. The substrates of FIGS. 5 and 7 have also undergone a heat treatment carried out at 392° C. for 136 minutes (FIG. 5) and at 460° C. for 60 minutes (FIG. 7), respectively.

It can be seen that for the same heat treatment carried out at 392° C. for 136 minutes, there are almost no platelets/microcavities present in the implanted zone when the substrate has also been implanted with $Si^+$ ions (FIG. 5), while they are already numerous without implantation (FIG. 4).

To a lesser extent, but still highly significant, it can also be seen that for the same heat treatment carried out at 460° C. for 60 minutes, the quantity, or at least the size of the platelets/microcavities, is greatly reduced when the substrate has also been implanted with $Si^+$ ions (FIG. 7) than without implantation (FIG. 6). Thus, implanting $Si^+$ ions can indeed neutralize or destroy the precursors of platelets/microcavities, which delays the appearance of microcracks and requires increasing the cleavage temperature.

For the substrates of FIGS. 4 and 6 (no $Si^+$ implantation), cleavage/fracture of implanted substrates occurs at a temperature of approximately 440° C., while for the substrates of FIGS. 5 and 7 (with additional $Si^+$ implantation), cleavage/fracture occurs at a temperature of at least 575° C.

Figure 2E:
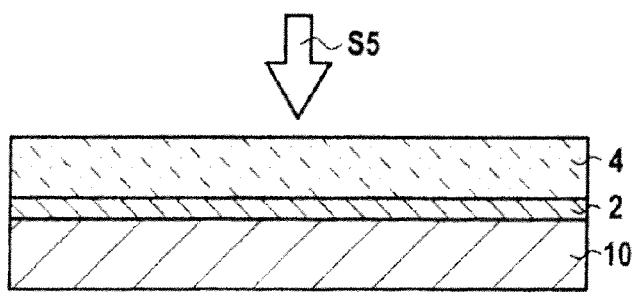
Figure 3:
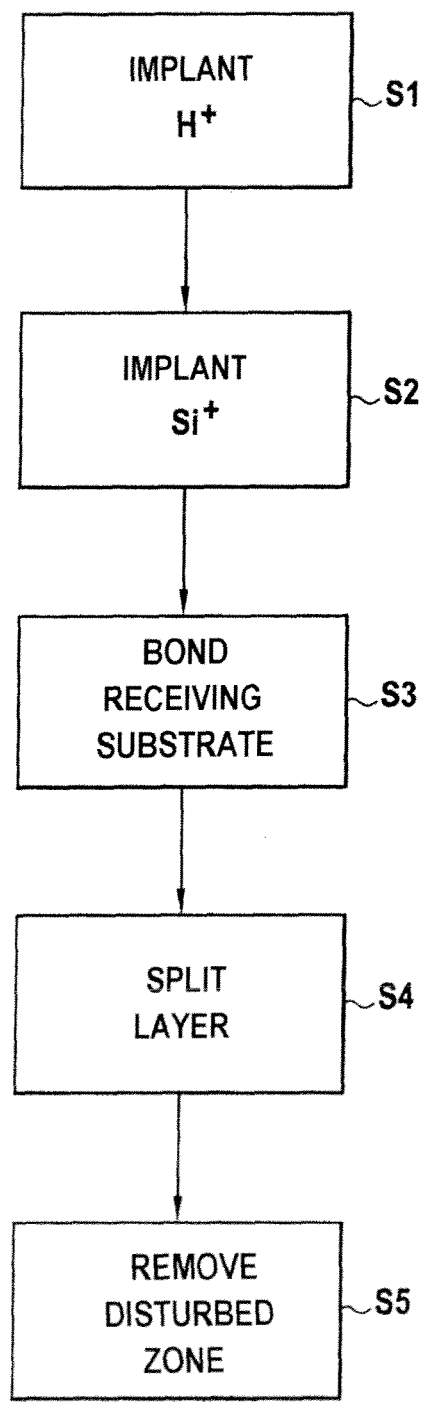
FIG. 3 is a flowchart of the steps carried out in FIGS. 2A to 2E.

A conventional polishing step (chemical-mechanical polishing) is then carried out in order to eliminate the disturbed zone and to reduce the degree of roughness of the fractured surface 9 of the transferred layer 4 (step S5, FIG. 2E). The disturbed zone may also be eliminated by selective chemical attack (etching), optionally followed by polishing to improve the surface roughness. A heat treatment in hydrogen and/or argon may also be carried out alone or in combination with polishing.

The invention claimed is:

1. A method of transferring a layer from a donor substrate onto a receiving substrate, comprising:

implanting at least one species into a first layer region of the donor substrate and forming precursors of platelets and/or microcavities in the first layer region, the first layer region of the donor substrate extending horizontally within the donor substrate and extending vertically from a first depth within the donor substrate through a first thickness of the donor substrate;

after implanting the at least one species into the first layer region of the donor substrate, implanting silicon ions into a second layer region of the donor substrate, the second layer region of the donor substrate extending horizontally within the donor substrate and extending vertically from a second depth within the donor substrate through a second thickness of the donor substrate, the first layer region of the donor substrate at least partially overlapping the second layer region of the donor substrate in the vertical direction such that at least a portion of the second layer region of the donor substrate is coextensive with and encompasses at least a portion of the first layer region of the donor substrate, the implantation of the silicon ions neutralizing and/or destroying at least some of the precursors of platelets and/or microcavities in the first layer region so as to increase a cleavage temperature required to cause cleavage of the donor substrate along a plane of weakness to be formed therein;

after implanting silicon ions into the second layer region of the donor substrate, bonding a face of the donor substrate with a face of the receiving substrate by wafer bonding; and heating the donor substrate, forming at least one of microcavities and platelets from the precursors and forming the plane of weakness in the first layer region of the donor substrate, and splitting the donor substrate by cleavage, at the cleavage temperature, along the plane of weakness.

2. The method of claim 1, wherein the at least one species are implanted into the first layer region of the donor substrate using a first implantation energy, and the silicon ions are implanted into the second layer region of the donor substrate using a second implantation energy, the second implantation energy being higher than the first implantation energy.

3. The method of claim 1, further comprising selecting an implantation dose of the silicon ions in the second layer region of the donor substrate to be sufficiently high to prevent cleavage of the donor substrate until a temperature of the donor substrate reaches more than 500° C. during the heating of the donor substrate.

4. The method of claim 3, further comprising selecting the implantation dose of the silicon ions to be lower than an implantation dose of the at least one species implanted into the first layer region of the donor substrate.

5. The method of claim 1, further comprising selecting the donor substrate to comprise a silicon substrate and selecting the cleavage temperature to be in a range extending from 575° C. to 650° C.

6. The method of claim 1, further comprising selecting the at least one species implanted into the first layer region of the donor substrate from the group consisting of hydrogen and helium.

7. The method of claim 1, further comprising treating the face of the donor substrate and the face of the receiving substrate and rendering the face of the donor substrate and the face of the receiving substrate hydrophobic.

8. The method of claim 1, further comprising selecting the donor substrate to comprise a semiconductor material.

9. The method of claim 3, further comprising selecting the implantation dose of the silicon ions in the second layer region of the donor substrate to be sufficiently high to prevent cleavage of the donor substrate until a temperature of the donor substrate reaches more than 575° C. during the heating of the donor substrate.

10. The method of claim 9, further comprising selecting the implantation dose of the silicon ions to be lower than an implantation dose of the at least one species implanted into the first layer region of the donor substrate.

11. The method of claim 2, further comprising selecting the donor substrate to comprise a silicon substrate and selecting the cleavage temperature to be in a range extending from 575° C. to 650° C.

12. A method of transferring a layer from a donor substrate onto a receiving substrate, comprising:
    implanting at least one ionic species into a first layer region within the donor substrate and forming precursors of platelets and/or microcavities in the first layer region, the first layer region extending horizontally within the donor substrate and extending vertically from a first depth from a face of the donor substrate through a first thickness of the donor substrate, the at least one ionic species comprising at least one ion configured to generate defects within the donor substrate upon heating the donor substrate;
    implanting silicon ions into a second layer region within the donor substrate, the second layer region extending horizontally within the donor substrate and extending vertically from a second depth from the face of the donor substrate through a second thickness of the donor substrate, the second layer region at least partially overlapping the first layer region in the vertical direction such that at least a portion of the second layer region of the donor substrate is coextensive with and encompasses at least a portion of the first layer region of the donor substrate, the implantation of the silicon ions neutralizing and/or destroying at least some of the precursors of platelets and/or microcavities in the first layer region so as to increase a cleavage temperature required to cause cleavage of the donor substrate along the first layer region;
    bonding a face of the donor substrate with a face of the receiving substrate using a wafer bonding process; and
    heating the donor substrate and causing formation of microcavities or platelets from the precursors in the donor substrate along the first layer region and an increase in a bonding energy between the face of the donor substrate and the face of the receiving substrate, and, upon reaching a cleavage temperature, cleaving the donor substrate along the first layer region and between the microcavities or platelets.

13. The method of claim 12, further comprising implanting the silicon ions into the second layer region within the donor substrate before bonding the face of the donor substrate with the face of the receiving substrate using the wafer bonding process.

14. The method of claim 12, wherein the at least one ionic species are implanted into the first layer region of the donor substrate using a first implantation energy, and the silicon ions are implanted into the second layer region of the donor substrate using a second implantation energy, the second implantation energy being higher than the first implantation energy.

15. The method of claim 12, further comprising selecting an implantation dose of the silicon ions in the second layer region of the donor substrate to be sufficiently high to prevent cleavage of the donor substrate until a temperature of the donor substrate reaches more than 500° C. during the heating of the donor substrate.

16. The method of claim 15, wherein the implantation dose of the silicon ions used during implantation of the silicon ions into the second layer region is lower than an implantation dose of the at least one ionic species used during implantation of the at least one ionic species into the first layer region.

17. The method of claim 16, further comprising selecting the donor substrate to comprise a silicon substrate, and selecting the cleavage temperature to be in a range extending from 575° C. to 650° C.

18. The method of claim 12, further comprising selecting the donor substrate to comprise a silicon substrate, and selecting the cleavage temperature to be in a range extending from 575° C. to 650° C.

19. The method of claim 12, wherein the second layer region completely overlaps the first layer region.

20. The method of claim 12, wherein the second depth is less than the first depth.

* * * * *